(12) United States Patent
Choi

(10) Patent No.: US 7,772,878 B2
(45) Date of Patent: Aug. 10, 2010

(54) PARALLEL RESISTOR CIRCUIT, ON-DIE TERMINATION DEVICE HAVING THE SAME, AND SEMICONDUCTOR MEMORY DEVICE HAVING THE ON-DIE TERMINATION DEVICE

(75) Inventor: Chang-Kyu Choi, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/346,816

(22) Filed: Dec. 30, 2008

(65) Prior Publication Data

US 2009/0322375 A1    Dec. 31, 2009

(30) Foreign Application Priority Data

Jun. 30, 2008    (KR) ...................... 10-2008-0063123

(51) Int. Cl.
*H03K 19/003*    (2006.01)
(52) U.S. Cl. .......................................... 326/30; 326/26
(58) Field of Classification Search ................... 326/30, 326/26
See application file for complete search history.

(56) References Cited

U.S. PATENT DOCUMENTS 7,068,065 B1 * 6/2006 Nasrullah .................... 326/30
7,123,048 B2 10/2006 Takekuma et al.
7,397,270 B1 * 7/2008 Luo et al. ...................... 326/32
7,443,193 B1 * 10/2008 Santurkar et al. ............. 326/30
7,495,467 B2 * 2/2009 Lin et al. ...................... 326/30

FOREIGN PATENT DOCUMENTS

KR    1020080038773 A    5/2008

OTHER PUBLICATIONS

Notice of Preliminary Rejection issued from Korean Intellectual Property Office on Jul. 28, 2009 with an English Translation.
Notice of Allowance issued from Korean Intellectual Property Office on Apr. 26, 2010.

* cited by examiner

*Primary Examiner*—James Cho
(74) *Attorney, Agent, or Firm*—IP & T Law Firm PLC

(57) ABSTRACT

A parallel resistor circuit that can reduce an error of a resistance value, an on-die termination having the same, and a semiconductor device having the on-die termination device. The semiconductor memory device includes a calibration circuit configured to pull up or pull down a predetermined node and compare a voltage of the predetermined node with a reference voltage to generate calibration codes, by using parallel resistor units that are turned on or off in response to the calibration codes. An output driver is configured to terminate a data output node to a pull-up or pull-down level to output data, by using the parallel resistor units. At least one of the parallel resistor units having at least two resistivities includes resistors with different resistivities connected to each other in parallel.

18 Claims, 6 Drawing Sheets

PARALLEL RESISTOR CIRCUIT, ON-DIE TERMINATION DEVICE HAVING THE SAME, AND SEMICONDUCTOR MEMORY DEVICE HAVING THE ON-DIE TERMINATION DEVICE

CROSS-REFERENCE TO RELATED APPLICATION

The invention claims priority of Korean patent application number 10-2008-0063123, filed on Jun. 30, 2008, which is incorporated by reference in its entirety.

BACKGROUND OF THE INVENTION

The invention relates to a parallel resistor circuit, an on-die termination having the same, and a semiconductor device having the on-die termination device, and more particularly, to a parallel resistor circuit which can reduce an error of a resistance value, an on-die termination having the same, and a semiconductor device having the on-die termination device.

As the operating speed of electrical products is increasing, a swing width of a signal interfaced between semiconductor devices is being gradually reduced for minimizing a delay time taken for signal transmission. However, the reduction in the swing width of the signal has a great influence on an external noise, causing the signal reflectance to become more critical at an interface terminal due to impedance mismatch. Such impedance mismatch is generally caused by an external noise, a variation of a power supply voltage, a change in an operating temperature, a change in a manufacturing process, etc. The impedance mismatch may lead to a difficulty in high-speed transmission of data and distortion of output data.

Therefore, in order to resolve the above problems, a memory device requiring high-speed performance employs an impedance matching circuit, which is called an ODT device, near around an input pad inside an IC chip. In a typical ODT scheme, source termination is performed at a transmitting end by an output circuit, and parallel termination is performed by a termination circuit connected in parallel with respect to a receiving circuit coupled to the input pad.

ZQ calibration refers to a procedure of generating calibration codes varying with process, voltage and temperature (PVT) conditions. The resistance of the ODT device, e.g., a termination resistance at a DQ pad in a memory device, is calibrated using the calibration codes resulting from the ZQ calibration. The ZQ calibration is named because the calibration is performed using a ZQ node that is a node for calibration.

FIG. 1 is a circuit diagram of a conventional calibration circuit of an ODT device.

Referring to FIG. 1, the conventional ODT device includes a calibration circuit 101 configured to perform ZQ calibration, and a termination circuit 131 configured to perform termination operation.

The calibration circuit 101 includes a first pull-up resistor unit 121, a second pull-up resistor unit 123, a pull-down resistor unit 125, a reference voltage generation unit 103, comparison units 105 and 107, a pull-up counting unit 109, and a pull-down counting unit 111, and performs ZQ calibration.

The comparison unit 105 compares a voltage of a ZQ node with a reference voltage VREF (generally set to VDDQ/2) to generate up/down signals. The voltage of the ZQ node is generated by connecting the first pull-up resistor unit 121 connected to the ZQ pad (outside a chip of the ZQ node) and a reference resistor 113 generally having the resistance of 240 Ω.

The pull-up counting unit 109 receives the up/down signals to generate pull-up calibration codes PCODE<0:N>. The pull-up calibration codes PCODE<0:N> turn on or off PMOS transistors of the first pull-up resistor unit 121 to thereby control the resistance of the first pull-up resistor unit 121. The controlled resistance of the first pull-up resistor unit 121 changes the voltage of the ZQ node again, and the comparison unit 105 compares the voltage of the ZQ node with the reference voltage VREF to output up/down signals. Through the above procedure, the first pull-up resistor unit 121 is calibrated such that a total resistance of the first pull-up resistor unit 121 is equal to the resistance of the reference resistor 113 (pull-up calibration).

The pull-up calibration codes PCODE<0:N> are input to the second pull-up resistor unit 123 to determine a total resistance of the second pull-up resistor unit 123. Here, the second pull-up resistor unit 123 has the same resistance as the first pull-up resistor unit 121 because it has the same configuration and receives the same code as the first pull-up resistor unit 121. Thereafter, a pull-down calibration is performed in a similar manner as the pull-up calibration. The pull-down calibration is performed using the comparison unit 107 and the pull-down counting unit 111 through the similar procedure to the pull-up calibration. The pull-down resistor unit 125 is calibrated such that a voltage of a node A is equal to the reference voltage VREF. That is, the pull-down resistor unit is 125 is calibrated such that the total resistance of the pull-down resistor unit 125 is equal to the total resistance of the second pull-up resistor unit 123 (pull-down calibration).

The termination circuit 131 performing the termination operation includes a pull-up termination resistor unit 141, and a pull-down termination resistor unit 143.

The pull-up and pull-down codes PCODE<0:N> and NCODE<0:N> generated by the ZQ calibration are input to pull-up and pull-down termination resistor units 141 and 143 to thereby determine the termination resistance for impedance matching. The pull-up calibration determining the resistance of the pull-up termination resistor unit 141 is performed by the pull-up calibration codes PCODE<0:N>. Likewise, the pull-down calibration determining the resistance of the pull-down termination resistor unit 143 is performed by the pull-down calibration codes NCODE<0:N>. The impedance matching with an external element can be accomplished by virtue of the resistance determined by the termination circuit 131.

Meanwhile, the ODT device does not always include both pull-up and pull-down resistor units. For example, only the pull-up resistor unit or the pull-down resistor unit may be used when the termination circuit 131 is used as an input buffer, whereas both the pull-up and pull-down resistor units should be used when the termination circuit is used as an output driver.

To be specific, as for a case where the termination circuit 131 is used as an output driver, the pull-up termination resistor unit 141 is turned on to enable a data pin DQ to 'High' when the termination circuit 131 outputs data 'High'. In contrast, the pull-down termination resistor unit 143 is turned on to disable the data pin DQ to 'Low' when the termination circuit 131 outputs data 'Low'.

FIGS. 2A and 2B are circuit diagrams of a conventional parallel resistor circuit.

Each of the resistor units 121, 123, 125, 141 and 143 of the ODT device of FIG. 1 includes a parallel resistor circuit illustrated in FIGS. 2A and 2B.

A plurality of parallel resistor units RSUM_0 to RSUM_14 of the parallel resistor circuit of FIG. 2A have respective resistances differing from one another, and are individually turned on or off in response to the respective pull-up calibration codes PCODE<0:N>. A total resistance of the parallel resistor circuit decreases gradually as the value N of the pull-up calibration code PCODE<0:N> increases. On the contrary, a total resistance of the parallel resistor circuit increases gradually as the value N of the pull-up calibration code PCODE<0:N> decreases. That is, when the value N of the pull-up calibration code PCODE<0:N> sequentially increases from 0 to 14, the parallel resistor units RSUM_0 to RSUM_14 are turned on sequentially from the parallel resistor unit RSUM_0 to the parallel resistor unit RSUM_14 and the resistance of the parallel resistor unit gradually decreases from the resistance of the parallel resistor unit RSUM_0 to that of the parallel resistor unit RSUM_14.

The conventional parallel resistor circuit of FIG. 2B also includes a plurality of parallel resistor units. A variation in a total resistance of the parallel resistor circuit according to the variation of pull-down calibration codes NCODE<0:N> is also identical to the resistance variation according to the variation of the pull-up calibration codes PCODE<0:N>.

A resistor with high resistance is made of a high resistivity material, and a resistor with low resistance is made of a low resistivity material. For example, the parallel resistor units RSUM_0 to RSUM_7 with high resistance may be made of a gate material with high resistivity, and the parallel resistor units RSUM_8 to RSUM_14 with low resistance may be made of a bit line material with low resistance. The resistivity means a resistance per unit area and unit length, and may vary with materials. When adopting a high resistivity material, it is possible to obtain a high resistance even using the small amount of the high resistivity material. The resistivity varies with a temperature. That is, while the resistivity of a conductor increases with an increase in a temperature, the resistivity of a semiconductor decreases with an increase in a temperature.

The resistivity of a material used for the resistor units 121, 123, 125, 141 and 143 varies due to process variations such as heat applied during fabrication of a semiconductor device, leading to a change in resistance. Therefore, a resistor made of a low resistivity material may have higher resistance than a resistor made of a high resistivity material, which is shown in FIG. 3.

FIG. 3 is a graph showing a total resistance variation of the conventional parallel resistor circuit of FIG. 2A according to pull-up calibration codes PCODE<0:N> when there are process variations.

The axis of abscissa indicates the value N of the pull-up calibration codes PCODE<0:N>, and the axis of ordinate indicates a resistance in units of ohm.

In FIG. 3, it can be observed that, due to the resistivity variation caused by process variations, the resistance of the parallel resistor unit RSUM_8 becomes higher than the resistance of the parallel resistor unit RSUM_7 although the parallel resistor unit RSUM_8 is lower in resistivity than the parallel resistor unit RSUM_7.

That is, the resistances of the conventional parallel resistor circuit included in the resistor units 121, 123, 125, 141 and 143 of the ODT device vary with process variations, and thus an error occurs during the ZQ calibration and termination operations, which makes it difficult to achieve an accurate impedance matching after all.

SUMMARY OF THE INVENTION

Embodiments of the invention are directed to providing a parallel resistor circuit that can reduce a resistance variation due to process variations, an on-die termination (ODT) device that can accurately achieve an impedance matching using the parallel resistor circuit, and a semiconductor device including the ODT device.

In accordance with an aspect of the invention, there is provided a parallel resistor circuit, which includes a plurality of parallel resistor units configured to be respectively turned on or off in response to control codes and have at least two resistivities, wherein at least one of the plurality of parallel resistor units comprises resistors with different resistivities.

In accordance with another aspect of the invention, there is provided a calibration circuit of an on-die termination (ODT) device, which includes: a calibration resistor unit configured to control a voltage of a predetermined node through an increase or decrease of a total resistance by using a plurality of parallel resistor units that are connected to the predetermined node and respectively turned on or off in response to calibration codes; and a code generation unit configured to calibrate the calibration resistor unit to an external resistor in response to a reference voltage and the voltage of the predetermined node, wherein at least one of the plurality of parallel resistor units having at least two resistivities comprises resistors with different resistivities connected to each other in parallel.

In accordance with still another aspect of the invention, there is provided an ODT device, which includes: a calibration circuit configured to compare a voltage of a predetermined node with a reference voltage to generate calibration codes by using a plurality of parallel resistor units that are connected to the predetermined node and respectively turned on or off in response to the calibration codes; and a termination circuit configured to perform an impedance matching by using a plurality of parallel resistor units that are respectively turned on or off in response to the calibration codes at a side of an input/output pad, wherein at least one of the plurality of parallel resistor units having at least two resistivities comprises resistors with different resistivities connected to each other in parallel.

In accordance with further another aspect of the invention, there is provided a semiconductor memory device, which includes: a calibration circuit configured to pull up or pull down a predetermined node and compare a voltage of the predetermined node with a reference voltage to generate calibration codes, by using a plurality of parallel resistor units that are respectively turned on or off in response to the calibration codes; and an output driver configured to terminate a data output node to a pull-up or pull-down level to output data, by using the plurality of parallel resistor units that are respectively turned on or off in response to the calibration codes, wherein at least one of the plurality of parallel resistor units having at least two resistivities comprises resistors with different resistivities connected to each other in parallel.

DESCRIPTION OF SPECIFIC EMBODIMENTS

Hereinafter, a parallel resistor circuit, an on-die termination (ODT) device having the same, and a semiconductor memory device having the ODT device in accordance with the invention will be described in detail with reference to the accompanying drawings.

Figure 4A:
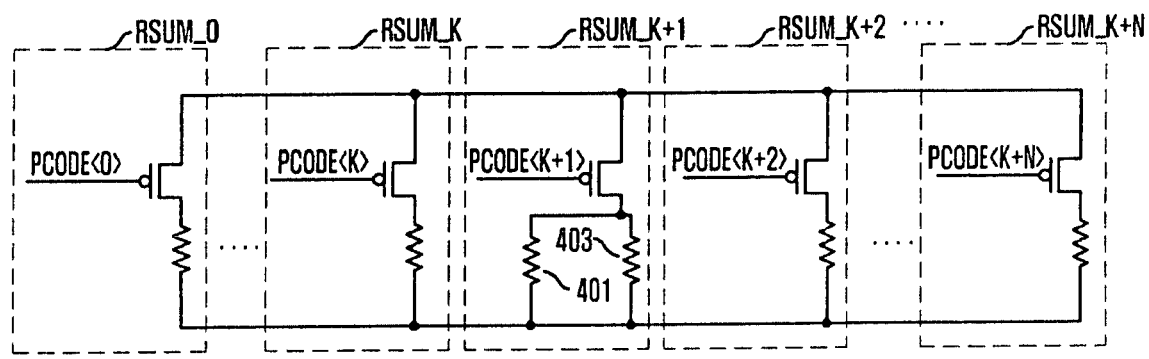
FIG. 4A is a circuit diagram of a parallel resistor circuit in accordance with an embodiment of the invention.

FIG. 4A is a circuit diagram of a parallel resistor circuit in accordance with an embodiment of the invention.

The parallel resistor circuit of the invention includes a plurality of parallel resistor units RSUM_0 to RSUM_K+N, which are turned on or off in response to control codes and have at least two resistivities. At least one of the plurality of parallel resistor units RSUM_0 to RSUM_K+N includes resistors with different resistivities that are connected to each other in parallel.

In FIG. 4A, the plurality of parallel resistor units RSUM_0 to RSUM_K have a first resistivity which is relatively high, whereas the plurality of parallel resistor units RSUM_K+2 to RSUM_K+N have a second resistivity which is relatively low. The parallel resistor unit RSUM_K+1 includes a resistor 401 having the first resistivity and a 403 having the second resistivity, which are connected to each other in parallel. The parallel resistor unit RSUM_K+1 connects the parallel resistor unit RSUM_K to the parallel resistor unit RSUM_K+2 in parallel. Herein, the parallel resistor unit RSUM_K has the minimum resistance among the parallel resistor units RSUM_0 to RSUM_K having the first resistivity, and the parallel resistor unit RSUM_K+2 has the maximum resistance among the parallel resistor units RSUM_K+2 to RSUM_K+N having the second resistivity. As described in the BACKGROUND OF THE INVENTION, a high resistivity material is used to form a resistor with high resistance, whereas a low resistivity material is used to form a resistor with low resistance.

To facilitate understanding, an embodiment where pull-up calibration codes set forth in the BACKGROUND OF THE INVENTION are used as the control codes will be described hereafter.

Similarly to the conventional parallel resistor circuit, to increase or decrease a total resistance of the parallel resistor circuit according to the pull-up calibration codes PCODE<0:N>, a plurality of parallel resistor units RSUM_0 to RSUM_K+N have resistances different from one another, and PMOS transistors are individually turned on or off in response to the respective pull-up calibration codes PCODE<0:N>. This makes it possible to control a total resistance of the parallel resistor circuit. However, among the parallel resistor units RSUM_0 to RSUM_K+N, the parallel resistor circuit of the invention further includes the parallel resistor circuit RSUM_K+1 where the resistors 401 and 403 with different resistivities are connected to each other in parallel, thereby solving the problem of the conventional art, which significantly differs the conventional parallel resistor circuit.

The resistivity varies with process variations such as thermal variation. Therefore, if the parallel resistor circuit RSUM_K+1 includes only a resistor having the first or second resistivity, the resistance of the parallel resistance circuit RSUM_K+1 may be greater than the resistance of the parallel resistor unit RSUM_K due to the process variations, which happens in the conventional parallel resistor circuit. However, the resistors 401 and 403 having the different resistivities are connected to each other in parallel in the parallel resistor unit RSUM_K+1, and therefore, the resistance of the parallel resistor unit RSUM_K+1 varies little although the first resistivity decreases and the second resistivity increases, and vice versa.

In order that the parallel resistor unit RSUM_K+1 may have a resistance between the minimum resistance of one of the plurality of parallel resistor units RSUM_0 to RSUM_K with the first resistivity and the maximum resistance of one of the plurality of parallel resistor units RSUM_K+2 to RSUM_N with the second resistivity, the resistor 401 with the first resistivity and the resistor 403 with the second resistivity have the same resistance in the parallel resistor unit RSUM_K+1. Furthermore, since the resistor 401 with the first resistivity and the resistor 403 with the second resistivity are connected to each other in parallel in the parallel resistor unit RSUM_K+1 each of the resistors 401 and 403 may have twice the resistance of one resistor in the case where the parallel resistor unit RSUM_K+1 includes only the one resistor.

To facilitate understanding, description will be made using specific numerical values. For example, it is assumed that the resistor 401 with the first resistivity and the resistor 403 with the second resistivity have the same resistance of 100 ohm, and the resistance of the parallel resistor unit RSUM_K+1 has the resistance of 50 ohm.

Even when the first resistivity decreases but the second resistivity increases due to the process variation so that the resistance of the resistor 401 with the first resistivity becomes 75 ohm and the resistance of the resistor 403 with the second resistivity becomes 125 ohm, the resistors 401 and 403 are connected to each other in parallel, and thus an equivalent resistance becomes approximately 46 ohm. That is, there is little resistance variation in spite of the process variations in the parallel resistor circuit of the invention. Accordingly, the parallel resistor unit RSUM_K+1 maintains the resistance between those of the parallel resistor units RSUM_K and RSUM_K+2 thus reducing an error of a total resistance of the parallel resistor circuit.

While the embodiment of FIG. 4A describes only the case where the parallel resistor circuit includes two groups of the parallel resistor units having two resistivities, the same technical principle is also applicable to the case where the parallel resistor circuit includes three or more groups of the parallel resistor units having three or more resistivities. For instance, if the parallel resistor circuit includes three groups of the parallel resistor units having three resistivities, two parallel resistor units serving as the parallel resistor unit RSUM_K+1 may be provided between the groups of the plurality of parallel resistor units having respective resistivities.

The control code illustrated in FIG. 4A is the calibration code used in the ODT device, but the parallel resistor circuit of FIG. 4A is applicable to all devices including the parallel resistor circuit controlled in response to the control code.

Figure 4B:
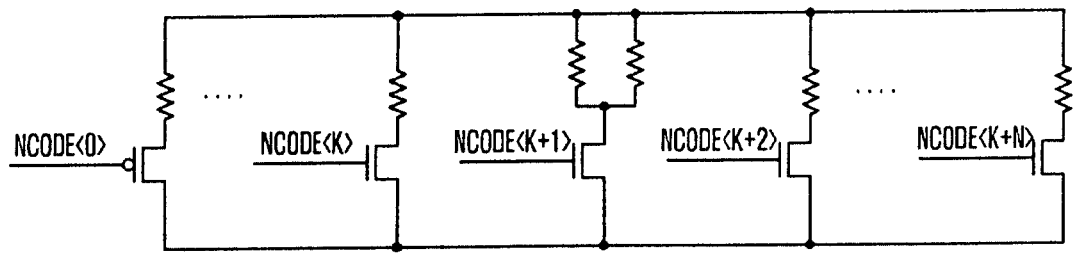
FIG. 4B is a circuit diagram of a parallel resistor circuit in accordance with another embodiment of the invention.

FIG. 4B is a circuit diagram of a parallel resistor circuit in accordance with another embodiment of the invention.

The parallel resistor circuit of FIG. 4B operates in response to pull-down calibration codes NCODE<0:N>, which differs from the embodiment of FIG. 4A. However, the parallel resistor circuit of FIG. 4B operates in the same manner as that of FIG. 4A except that it employs an NMOS transistor instead of a PMOS transistor.

For reference, the reason why the PMOS transistor is used in the embodiment of FIG. 4A because it is used as a pull-up resistor, and the reason why the NMOS transistor is used in the embodiment of FIG. 4B because it is used as a pull-down resistor.

Figure 5:
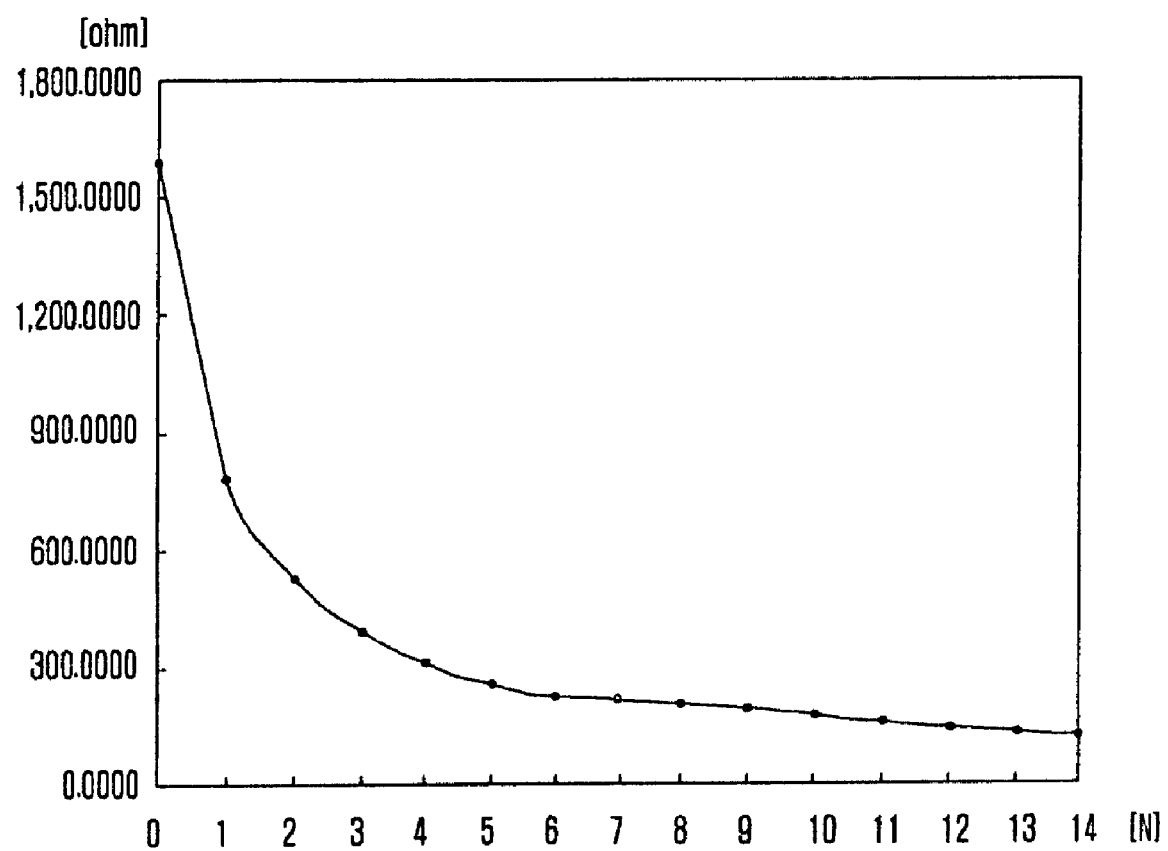
FIG. 5 is a graph showing a total resistance variation of the parallel resistor circuit of FIG. 4A according to a pull-up calibration code when there is process variation.

FIG. 5 is a graph showing a total resistance variation of the parallel resistor circuit of FIG. 4A according to the pull-up calibration codes PCODE<0:K+N> when there are process variations.

The axis of abscissa indicates the value N of the pull-up calibration codes PCODE<0:N>, and the axis of ordinate indicates a resistance in units of ohm. FIG. 5 illustrates the resistance variation versus the value N of the calibration code in the case where the parallel resistor circuit of FIG. 4A includes fifteen number of the parallel resistor units, that is, K=7 and N=8.

Figure 3:
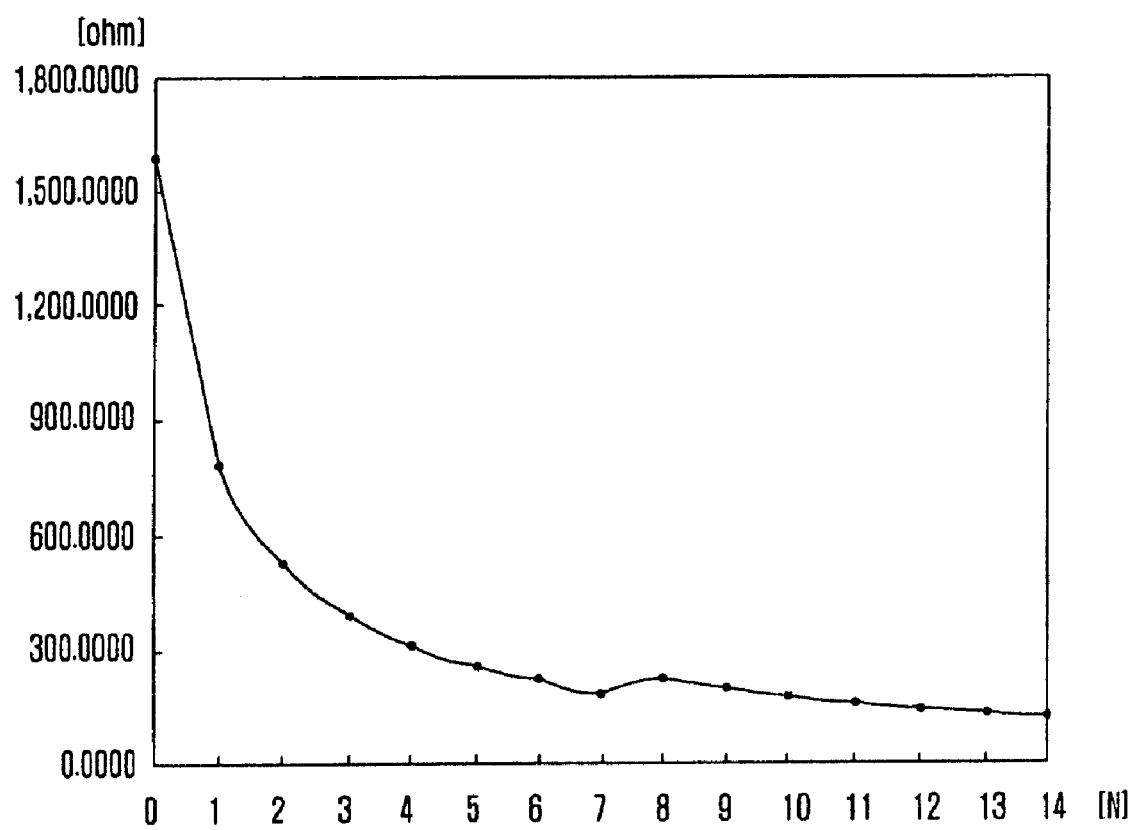
FIG. 3 is a graph showing a total resistance variation of the parallel resistor circuit of FIG. 2A according to a pull-up calibration code when there are process variations.

The total resistance of the parallel resistor circuit decreases as the value N of the pull-up calibration code PCODE<0:N> increases. The pull-up calibration code PCODE<8> indicates that the parallel resistor unit RSUM_K+1 of FIG. 4A is turned on, and corresponds to the pull-up calibration code PCODE<8> of FIG. 3. It can be observed that the resistance of the parallel resistor unit RSUM_K+1 does not exceed the resistance of the parallel resistor unit RSUM_K turned on in response to the pull-up calibration code PCODE<7> in case where the resistivity of a high resistivity material decreases and the resistivity of a low resistivity material increases due to process variations and the parallel resistor unit RSUM_K+1 is turned on in response to the pull-up calibration code PCODE<8>. This noticeably differs from the result of FIG. 3.

Figure 6:
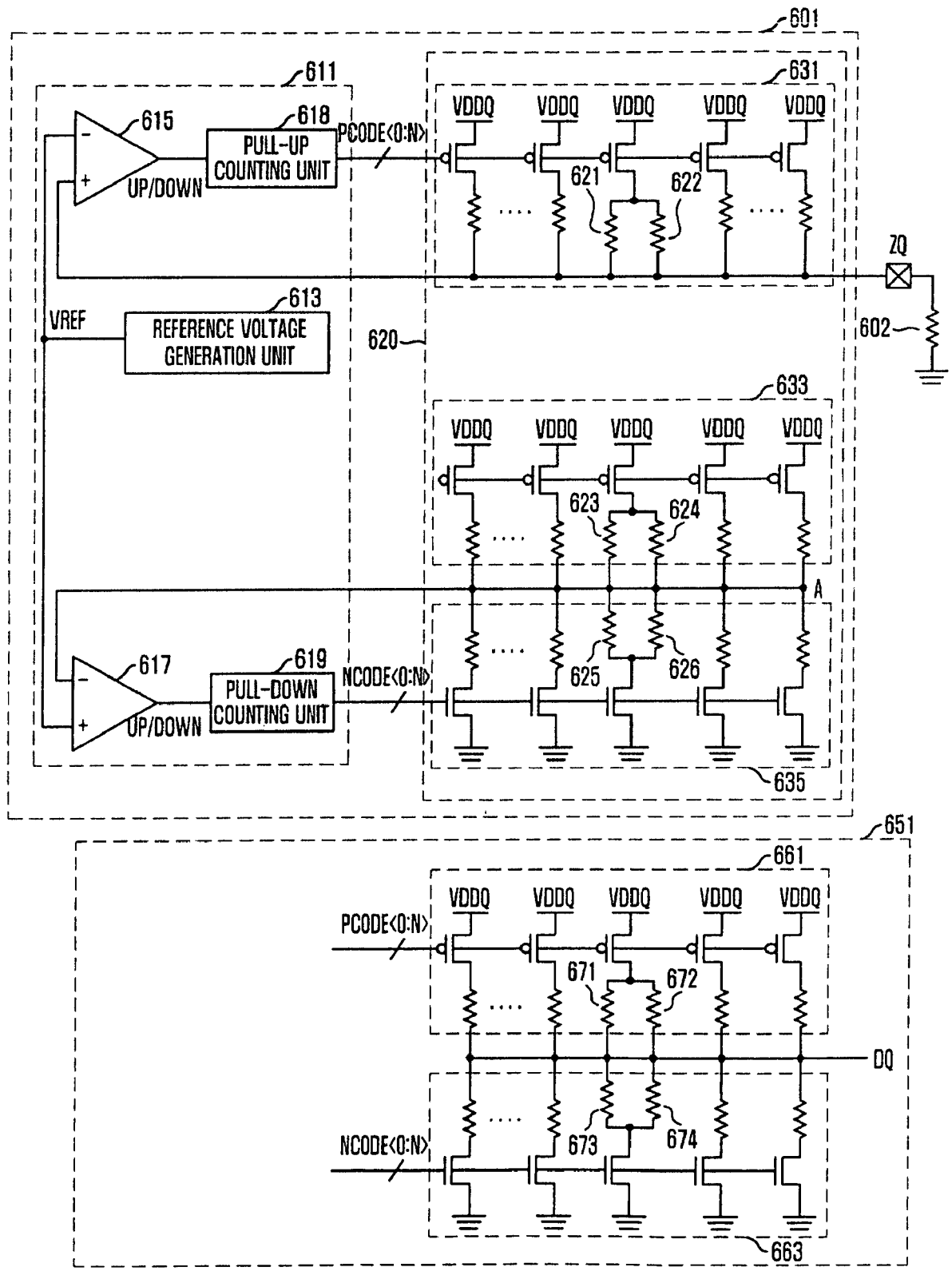
FIG. 6 is an ODT device including the parallel resistor circuits of FIGS. 4A and 4B.

FIG. 6 is an ODT device including the parallel resistor circuits of FIGS. 4A and 4B.

Referring to FIG. 6, the ODT device using the parallel resistor circuits of FIGS. 4A and 4B includes a calibration circuit 601 and a termination circuit 651. The calibration circuit 601 compares a voltage of a predetermined node (e.g., A or ZQ node) with a reference voltage VREF using a plurality of parallel resistor units 631, 633 and 635 to generate calibration codes PCODE<0:N> and NCODE<0:N>. Herein, the plurality of parallel resistor units 631, 633 and 635 are connected to the predetermined node (e.g., A or ZQ node) in parallel and are turned on or off in response to calibration codes PCODE<0:N> and NCODE<0:N>. The termination circuit 651 performs an impedance matching using a plurality of parallel resistor units 661 and 663 individually turned on or off in response to the calibration codes PCODE<0:N> and NCODE<0:N> at input/output pad (DQ). At least one of the plurality of parallel resistor units 631, 633, 635, 661 and 663, which have at least two different resistivities, includes resistors with different resistivities connected to each other in parallel.

The calibration circuit 601 includes a calibration resistor unit 620 and a code generation unit 611. The calibration resistor unit 620 increases or decreases a total resistance to control the voltage of the predetermined node (e.g., A or ZQ node) by using the resistor units 631, 633 and 635 that are connected to the predetermined node (e.g., A or ZQ node) in parallel and individually turned on or off in response to the calibration codes PCODE<0:N> and NCODE<0:N>. The code generation unit 611 generates the calibration codes PCODE<0:N> and NCODE<0:N> that calibrate the calibration resistor unit 620 to an external resistor 602 in response to the reference voltage VREF and the voltage of the predetermined node (e.g., A or ZQ node).

Figure 1:
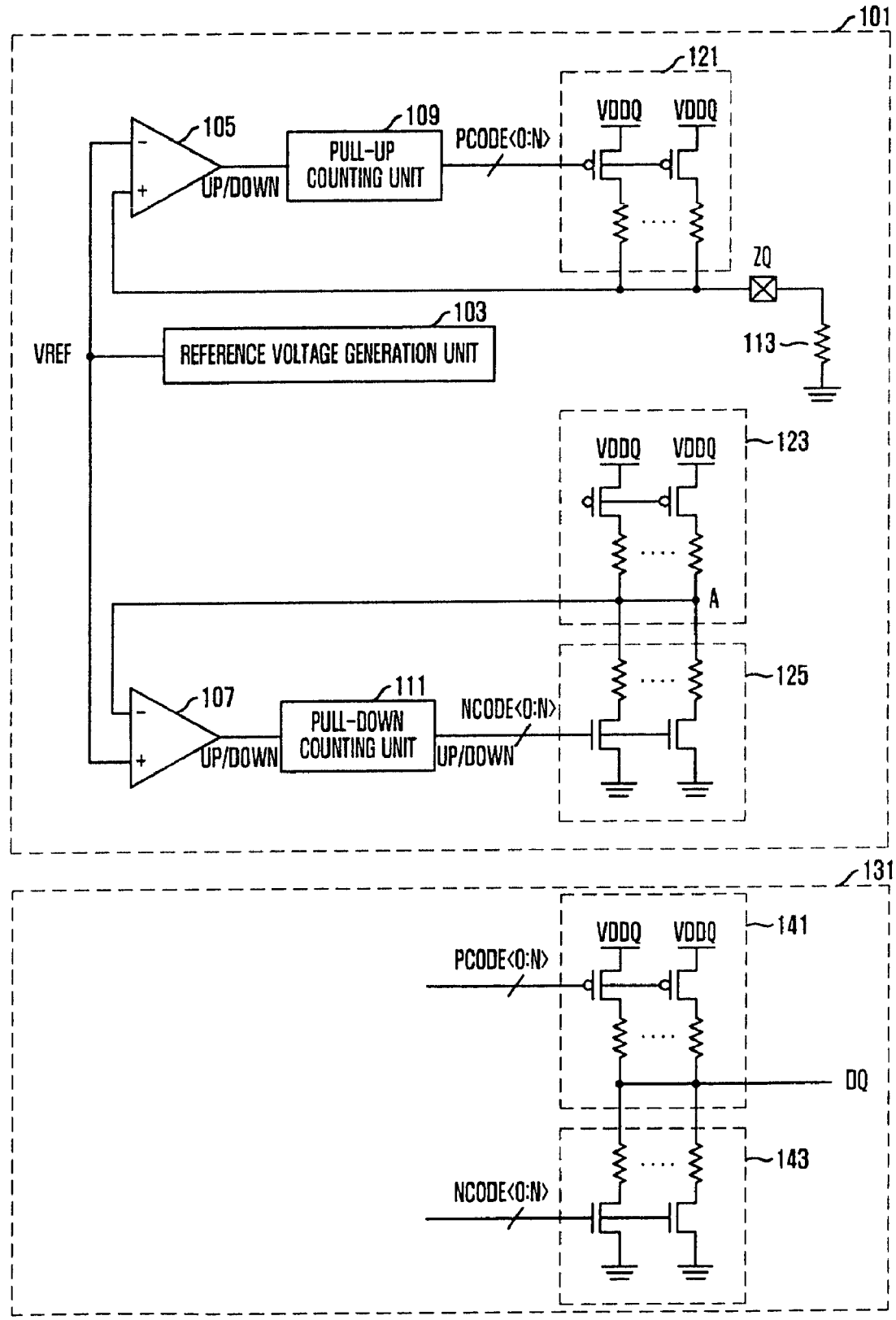
FIG. 1 is a block diagram of a conventional on-die termination (ODT) device.
Figure 2A:
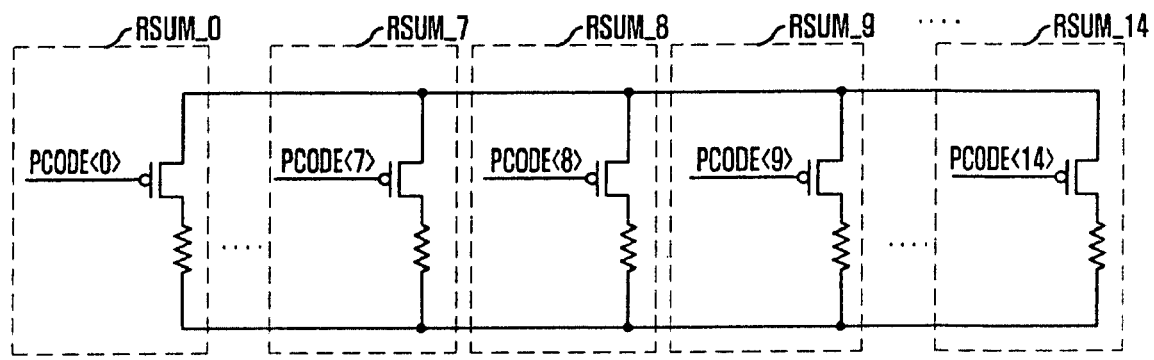
FIGS. 2A and 2B are circuit diagrams of conventional parallel resistor circuits.
Figure 2B:
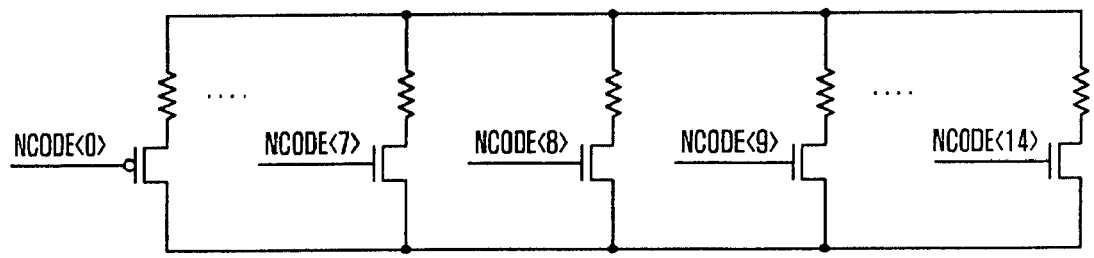

The ODT device of FIG. 6 operates in the same manner as the ODT device of FIG. 1. However, the ODT device of FIG. 6 includes the parallel resistor circuit of the invention instead of a plurality of resistors (see 121, 123, 125, 141 and 143 in FIG. 1) used in the conventional ODT device of FIG. 1. Each of the plurality of resistor units 631, 633 and 661 serving as pull-up resistors includes the parallel resistor circuit of FIG. 4A, and each of the plurality of resistor units 635 and 663 serving as pull-down resistors includes the parallel resistor circuit of FIG. 4B.

The ODT device of FIG. 6 can perform calibration operation and termination operation more accurately because the parallel resistor circuits of FIGS. 4A and 4B can reduce a resistance variation caused by process variations.

Meanwhile, the ODT device does not always include both a pull-up resistor unit and a pull-down resistor unit, which has been described in the BACKGROUND OF THE INVENTION. For example, only the pull-up resistor unit or the pull-down resistor unit may be used when the termination circuit 651 is used as an input buffer, whereas both the pull-up and pull-down resistor units should be used when the termination circuit is used as an output driver.

For instance, when the ODT device performs a pull-up termination operation only, the calibration circuit 601 includes a reference voltage generation unit 613, a comparison unit 615, a pull-up counting unit 618, and the parallel resistor unit 631, and generates only the pull-up calibration codes PCODE<0:N>. The termination circuit 651 includes the parallel resistor unit 661 serving as a pull-up resistor.

When the ODT device performs a pull-down termination operation only, the calibration circuit 601 includes the reference voltage generation unit 613, a comparison unit 617, a pull-down counting unit 619, and the parallel resistor unit 635, and generates only the pull-down calibration codes NCODE<0:N>. The termination circuit 651 includes the parallel resistor unit 663 serving as a pull-down resistor. The resistors of the parallel resistor unit 635 serving as the pull-down resistor are connected to the ZQ node.

In accordance with the invention, it is possible to reduce a resistance variation of a parallel resistor circuit due to process variations by including one or more parallel resistor units where resistors with different resistivities are connected to each other in parallel, and also to achieve an accurate impedance matching by performing an impedance matching using the parallel resistor circuit.

While the invention has been described with respect to the specific embodiments, it will be apparent to those skilled in the art that various changes and modifications may be made without departing from the spirit and scope of the invention as defined in the following claims.

What is claimed is:

1. A parallel resistor circuit, comprising a plurality of parallel resistor units configured to be respectively turned on or off in response to control codes, wherein a resistor unit among the plurality of parallel resistor units includes a plurality of resistors having different resistivities from each other, wherein the plurality of parallel resistor units comprise a first group of resistor units, each having a first resistivity, and a second group of resistor units, each having a second resistivity, wherein the first resistivity is lower than the second resistivity, and a maximum resistance of a resistor unit among the first group of resistor units is smaller than a minimum resistance of a resistor unit among the second group of resistor units.

2. The parallel resistor circuit as recited in claim 1, wherein the resistor unit having the maximum resistance is connected to the resistor unit having the minimum resistance.

3. The parallel resistor circuit as recited in claim 1, wherein a resistor unit among the plurality of parallel resistor units has a resistance between the maximum resistance and the minimum resistance.

4. The parallel resistor circuit as recited in claim 1, wherein the resistors with different resistivities from each other each have the same resistance.

5. The parallel resistor circuit as recited in claim 1, wherein the control codes are calibration codes.

6. A calibration circuit of an on-die termination (ODT) device, comprising:
- a calibration resistor unit configured to control a voltage of a predetermined node through an increase or decrease of a total resistance;
- a plurality of parallel resistor units configured to be coupled to the predetermined node and respectively turned on or off in response to calibration codes by the calibration resistor unit; and
- a code generation unit configured to calibrate the calibration resistor unit to an external resistor in response to a reference voltage and the voltage of the predetermined node,
- wherein a resistor unit among the plurality of parallel resistor units includes a plurality of resistors having different resistivities from each other and coupled to each other in parallel,
- wherein the plurality of parallel resistor units comprise:
  - a first group of resistor units, each having a first resistivity lower than a second resistivity; and
  - a second group of resistor units. each having the second resistivity,
    - wherein a maximum resistance of a resistor unit among the first group of resistor units is smaller than a minimum resistance of a resistor unit among the second group of resistor units.

7. The calibration circuit as recited in claim 6, wherein the resistor unit having the maximum resistance is connected to the resistor unit having the minimum resistance.

8. The calibration circuit as recited in claim 6, wherein a resistor unit among the plurality of resistor units has a resistance between the maximum resistance and the minimum resistance.

9. The calibration circuit as recited in claim 6, wherein the resistors with different resistivities from each other each have the same resistance.

10. An ODT device, comprising:
- a calibration circuit configured to compare a voltage of a predetermined node with a reference voltage to generate calibration codes;
- a first plurality of parallel resistor units that are connected to the predetermined node and respectively turned on or off in response to the calibration codes by the calibration circuit;
- a termination circuit configured to perform an impedance matching;
- a second plurality of parallel resistor units that are respectively turned on or off in response to the calibration codes at a side of an input/output pad by the termination circuit; and
- a resistor unit having at least two resistivities,
  - wherein the resistor unit having at least two resistivities is among the first and second pluralities of parallel resistor units, and
  - wherein the resistor unit having at least two resistivities includes resistors having different resistivities and coupled to each other in parallel.

11. The ODT device as recited in claim 10, further comprising:
- a first group of resistor units among the plurality of parallel resistor units, each resistor unit in the first group having a first resistivity;
- a second group of resistor units among the plurality of parallel resistor units, each resistor unit in the second group having a second resistivity,
- wherein the first resistivity is lower than the second resistivity, and
- wherein a maximum resistance of a resistor unit among the first group of resistor units is smaller than a minimum resistance of a resistor unit among the second group of resistor units.

12. The ODT device as recited in claim 11, wherein the resistor unit having the maximum resistance is connected to the resistor unit having the minimum resistance.

13. The ODT device as recited in claim 11, wherein a resistor unit among the plurality of parallel resistor units has a resistance between the maximum resistance and the minimum resistance.

14. The ODT device as recited in claim 11, wherein the resistors with different resistivities from each other each have the same resistance.

15. A semiconductor memory device, comprising:
- a calibration circuit configured to pull up or pull down a predetermined node and compare a voltage of the predetermined node with a reference voltage to generate calibration codes;
- a plurality of parallel resistor units configured to be respectively turned on or off in response to the calibration codes by the calibration circuit; and
- an output driver configured to terminate a data output node to a pull-up or pull-down level to output data, the output driver including at least one of the plurality of parallel resistor units,
- a resistor unit among the plurality of parallel resistor units includes a plurality of resistors having different resistivities from each other and coupled to each other in parallel,
- wherein the plurality of parallel resistor units comprise:
  - a first group of resistor units, each having a first resistivity lower than a second resistivity;
  - a second group of resistor units, each having the second resistivity,
    - wherein a maximum resistance of a resistor unit among the first group of parallel resistor units is smaller than a minimum resistance of a resistor unit among the second group of parallel resistor units.

16. The semiconductor memory device as recited in claim 15, wherein the resistor unit having the maximum resistance is connected to the resistor unit having the minimum resistance.

17. The semiconductor memory device as recited in claim 15, wherein a resistor unit among the plurality of parallel resistor units has a resistance between the maximum resistance and the minimum resistance.

18. The semiconductor memory device as recited in claim 15, wherein the resistors with different resistivities have the same resistance.

* * * * *